(12) United States Patent
Li et al.

(10) Patent No.: US 12,074,539 B2
(45) Date of Patent: Aug. 27, 2024

(54) NORMAL-TEMPERATURE HEAT ENGINE POWER GENERATION DEVICE BASED ON DRINKING BIRD

(71) Applicant: Shanghai University, Shanghai (CN)

(72) Inventors: Zhongjie Li, Shanghai (CN); Xuzhang Peng, Shanghai (CN); Yan Peng, Shanghai (CN); Jun Luo, Shanghai (CN); Shaorong Xie, Shanghai (CN); Huayan Pu, Shanghai (CN)

(73) Assignee: SHANGHAI UNIVERSITY, Shanghai (CN)

( * ) Notice: Subject to any disclaimer, the term of this patent is extended or adjusted under 35 U.S.C. 154(b) by 604 days.

(21) Appl. No.: 17/462,372

(22) Filed: Aug. 31, 2021

(65) Prior Publication Data

US 2022/0399836 A1 Dec. 15, 2022

(30) Foreign Application Priority Data

Jun. 10, 2021 (CN) .......................... 202110645723.7

(51) Int. Cl.
| | |
|---|---|
| *H01L 41/113* | (2006.01) |
| *A63H 15/04* | (2006.01) |
| *H02N 11/00* | (2006.01) |
| *H10N 30/30* | (2023.01) |
| *H10N 30/853* | (2023.01) |

(52) U.S. Cl.
CPC ........... *H02N 11/008* (2013.01); *A63H 15/04* (2013.01); *H10N 30/306* (2023.02); *H10N 30/853* (2023.02)

(58) Field of Classification Search
CPC .... H10N 30/30; H10N 30/302; H10N 30/304; H10N 30/306; H10N 30/308; A63H 29/14; A63H 13/00; A63H 13/005; A63H 13/02
USPC .......................................................... 310/339
See application file for complete search history.

(56) References Cited

U.S. PATENT DOCUMENTS

| | | | | |
|---|---|---|---|---|
| 5,346,421 A | * | 9/1994 | Yeh ........................ | A63H 13/00 446/213 |
| 2010/0237631 A1 | * | 9/2010 | Yu ............................. | F03G 7/10 74/DIG. 9 |
| 2011/0193350 A1 | * | 8/2011 | Rastegar .............. | H02K 7/1876 290/1 R |

* cited by examiner

*Primary Examiner* — Derek J Rosenau

(57) ABSTRACT

A normal-temperature heat engine power generation device based on a drinking bird is provided. The device includes a drinking bird body, a piezoelectric module and an electromagnetic module. The piezoelectric module includes a cantilever beam, a piezoelectric sheet arranged on the cantilever beam and working loads arranged at an end of the cantilever beam. when a head of the drinking bird body swings downwards, a tip of a beak can impact the working loads. The electromagnetic module includes magnets, coils and coil magnet conducting columns. The magnets are arranged at a bottom of a spherical bottom of the drinking bird body, and the coil magnet conducting columns sleeving the coils are arranged on a base of the drinking bird body.

9 Claims, 4 Drawing Sheets

NORMAL-TEMPERATURE HEAT ENGINE POWER GENERATION DEVICE BASED ON DRINKING BIRD

CROSS REFERENCE TO RELATED APPLICATION

This application claims the priority of Chinese Patent Application No. 202110645723.7 entitled "Normal-temperature Heat Engine Power Generation Device Based on Drinking Bird" filed with the Chinese Patent Office on Jun. 10, 2021, which is incorporated herein by reference in its entirety.

TECHNICAL FIELD

The present disclosure relates to the technical field of energy harvesting devices, and in particular to a normal-temperature heat engine power generation device based on a drinking bird.

BACKGROUND ART

The Internet of Things is an intelligent infrastructure consisting of uniquely identifiable equipment capable of wireless communication with each other, service and people on a large scale through the Internet. The Internet of Things is intended to make the Internet ubiquitous, and is likely to influence many aspects of the living quality of users. The Internet of Things has been widely used in the last few years, and the number of networking equipment exceeds 50 billion. Therefore, it is imperative to improve the energy efficiency and service life of Internet-of-things equipment.

Conventional batteries or power supplies face the problems such as limited service life and expensive maintenance cost. Energy harvesting technology is the key to solve the problem and has received more and more research attention in recent years. Energy harvesting, namely energy generation from the environment, is a promising solution that does not require battery replacement, can prolong the service life of batteries, and provide satisfactory experience quality for the Internet-of-things equipment. The Internet-of-things equipment can capture renewable energy sources, such as solar radiation, wind and human motion mechanical energy, in the environment by installing energy harvesting devices, so that the maintenance burden caused by battery replacement is reduced, and the cost is reduced.

The piezoelectric energy harvester is characterized by exhibiting the optimal performance at resonant frequencies, and the major aspects of the performance include output voltage, power and the like. The cantilever type piezoelectric energy harvesting device typically has low-level average power output, mostly in hundreds of microwatts. The electromagnetic energy harvester is large in output current and high in output power. Therefore, the piezoelectric energy harvester and the electromagnetic energy harvester can cooperate with each other to form a hybrid energy harvester, and the energy harvesting efficiency can be improved, so that more mechanical energy in the system can be converted into electric energy. The drinking bird is a typical heat engine which complies with the law of thermodynamics, and can convert water into mechanical energy for continuous movement, so that kinetic energy is continuously provided for the hybrid power generation device.

Therefore, for meeting the development of the Internet of things, it is a key factor to design a normal-temperature heat engine harvesting device which is simple in structure, high in efficiency and high in output.

SUMMARY

The embodiments aim to provide a normal-temperature heat engine power generation device based on a drinking bird to solve the problems existing in the prior art. Piezoelectric energy harvesting and electromagnetic energy harvesting can be combined, heat energy in the environment can be harvested by fully utilizing a normal-temperature heat engine such as the drinking bird, and large output power is generated.

In order to achieve the above-mentioned purpose, the present disclosure provides the following solutions:

The present disclosure provides a normal-temperature heat engine power generation device based on a drinking bird, which includes a drinking bird body, a piezoelectric module and an electromagnetic module. The piezoelectric module is opposite to the drinking bird body. The piezoelectric module includes a cantilever beam, a piezoelectric sheet arranged on the cantilever beam and working loads arranged at an end of the cantilever beam. When a head of the drinking bird body swings downwards, a tip of a beak can impact the working loads; and The electromagnetic module includes magnets, coils and coil magnet conducting columns, the magnets are arranged at a bottom of a spherical bottom of the drinking bird body. The coil magnet conducting columns are arranged on a base of the drinking bird body and are arranged in a circular arc shape. Each of the coil is sleeved on outside of corresponding coil magnet conducting column. When the magnets swing along with the spherical bottom of the drinking bird body, the magnets cut magnetic induction lines of the coils to generate a voltage.

In some embodiments, the piezoelectric module further may include a substrate, a middle shaft, a shaft seat and cantilever beam clamps. The middle shaft may be fixed to the substrate through the shaft seat. The cantilever beam may be fixed on the middle shaft through the cantilever beam clamps.

In some embodiments, the piezoelectric sheet may be adhered to a position of the cantilever beam having a maximum bending deflection through conductive epoxy adhesive. A width of the piezoelectric sheet may be same as that of the cantilever beam, so that a deformation amount of the piezoelectric sheet is increased.

In some embodiments, the piezoelectric sheet may be made of a piezoelectric ceramic transducer (PZT) piezoelectric ceramic material.

In some embodiments, the drinking bird body may include a base, supports, a swing frame, counterweights and a swinging device. The swinging device may include a head, a branch pipe and a spherical bottom. The base may be U-shaped, the supports may be arranged on two sides of a top of the base respectively. The swing frame may be connected between two the supports, the swing frame and the supports may be movably connected, a sleeve may be arranged in a middle of the swing frame, the branch pipe may be fixed in the sleeve. The head may be arranged at a top of the branch pipe, the spherical bottom may be arranged at a bottom of the branch pipe. A through hole communicating with the branch pipe may be formed in the head, the counterweights may be arranged at a top end of the head. A diameter of the head may be smaller than that of the spherical bottom.

In some embodiments, the head may be a thin-wall glass ball wrapped with water-absorbing cloth, the spherical bottom may be a thin-wall glass ball, the branch pipe may be a glass pipe, and an inner cavity of the head, an inner cavity of the branch pipe and an inner cavity of the spherical bottom may be communicated to form a cavity filled with diethyl ether liquid.

In some embodiments, the coil magnet conducting columns may be made of a material with high magnetic conductivity and low magnetic resistance.

In some embodiments, the coils may be shaped as a square.

In some embodiments, the magnets may be arranged in a mode that N and S magnetic poles are alternated.

Compared with the prior art, the embodiments have the following beneficial technical effects:

According to the normal-temperature heat engine power generation device based on a drinking bird, the drinking bird is combined with an energy harvesting device, so that the purpose of utilizing heat energy to generate power at normal temperature is achieved. An electromagnetic energy harvesting technology and a piezoelectric energy harvesting technology are combined, and the comprehensive performance of a hybrid power system is superior to that of each independent hybrid power system.

BRIEF DESCRIPTION OF THE DRAWINGS

To more clearly illustrate the embodiment of the present disclosure or the technical scheme in the prior art, the following briefly introduces the attached figures to be used in the embodiment. Apparently, the attached figures in the following description show merely some embodiments of the present disclosure, and those skilled in the art may still derive other drawings from these attached figures without creative efforts.

Figure 1:
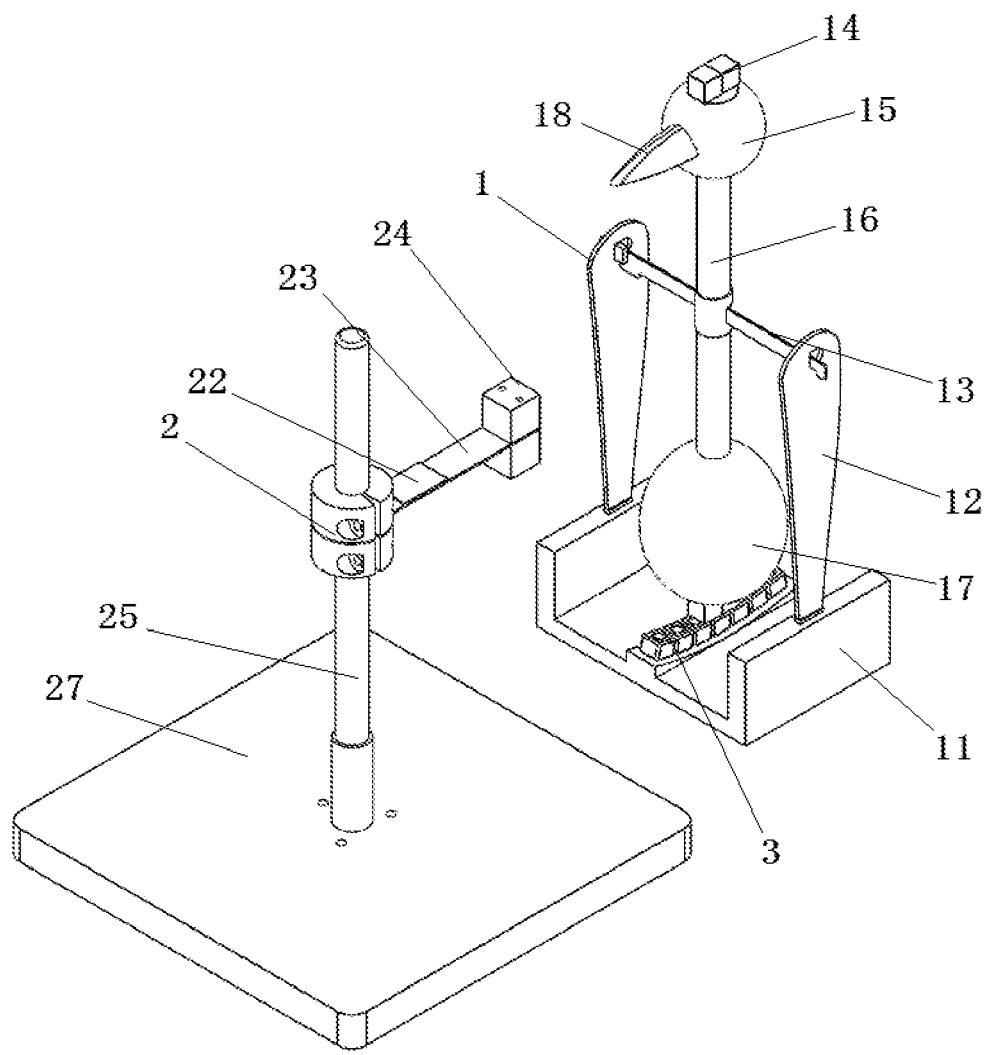
FIG. 1 is a schematic structural diagram of the normal-temperature heat engine power generation device based on a drinking bird according to the present disclosure.

List of reference characters: 1 drinking bird body; 11 base; 12 support; 13 swing frame; 14 counterweights; 15 head; 16 branch pipe; 17 spherical bottom; 18 beak;

2 piezoelectric module; 21 cantilever beam clamp; 22 piezoelectric sheet; 23 cantilever beam; 24 working load; 25 middle shaft; 26 shaft seat; 27 substrate;

3 electromagnetic module; 31 magnet; 32 coil magnet conducting column; and 33 coil.

DETAILED DESCRIPTION OF THE EMBODIMENTS

The following clearly and completely describes the technical scheme in the embodiments of the present disclosure with reference to the attached figures in the embodiments of the present disclosure. Apparently, the described embodiments are merely a part rather than all of the embodiments of the present disclosure. All other embodiments obtained by those skilled in the art based on the embodiments of the present disclosure without creative efforts shall fall within the protection scope of the present disclosure.

The embodiments aim to provide a normal-temperature heat engine power generation device based on a drinking bird, which is used for solving the problems in the prior art.

To make the foregoing objective, features and advantages of the present disclosure clearer and more comprehensible, the present disclosure is further described in detail below with reference to the attached figures and specific embodiments.

Figure 2:
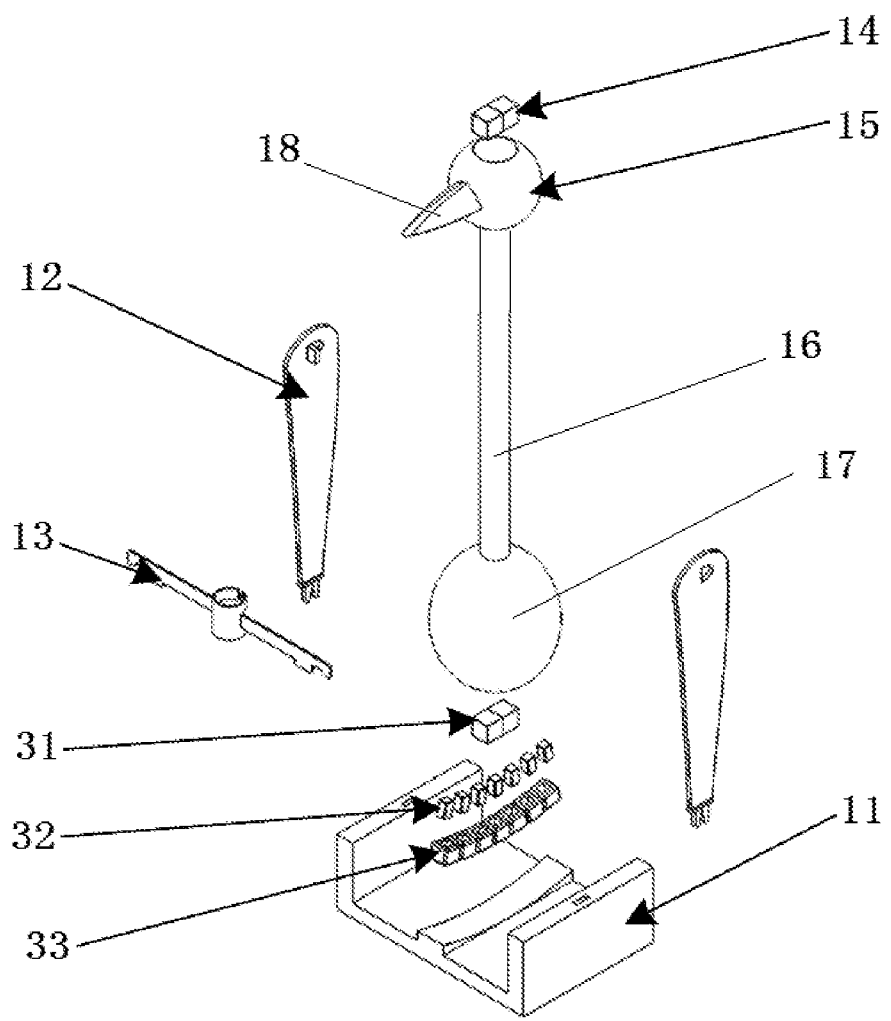
FIG. 2 is an exploded view of a drinking bird body according to the present disclosure.
Figure 3:
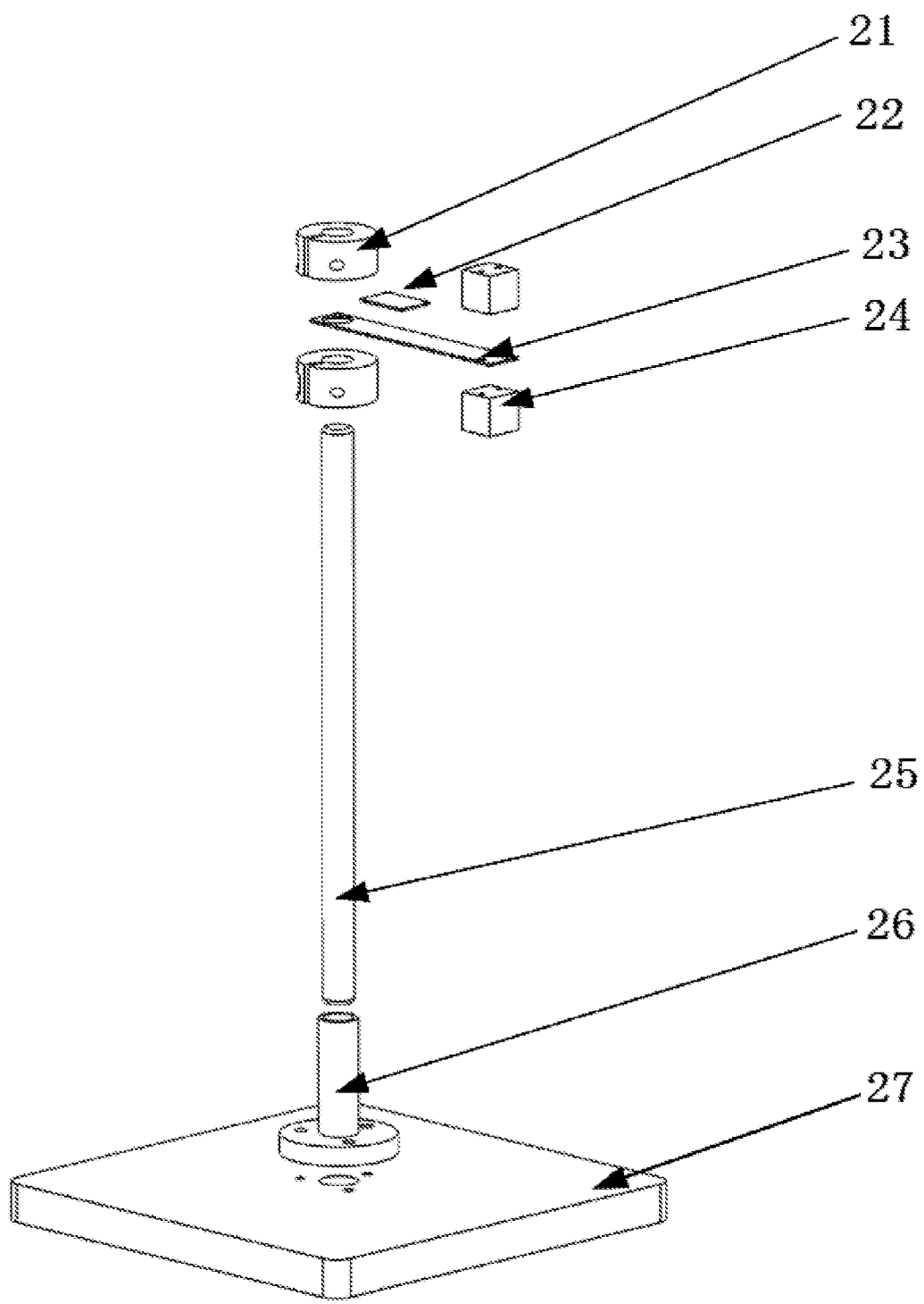
FIG. 3 is an exploded view of a piezoelectric module according to the present disclosure.

The normal-temperature heat engine power generation device based on a drinking bird in the present embodiment, as shown in FIGS. 1 to 3, includes a drinking bird body 1, a piezoelectric module 2 and an electromagnetic module 3. The piezoelectric module 2 is opposite to the drinking bird body 1. The piezoelectric module 2 includes a cantilever beam 23, a piezoelectric sheet 22 arranged on the cantilever beam 23 and working loads 24 arranged at an end of the cantilever beam 23; when a head 15 of the drinking bird body 1 swings downwards, a tip of a beak 19 can impact the working loads 24.

The electromagnetic module 3 includes magnets 31, coils 33 and coil magnet conducting columns 32, the magnets 31 are arranged at a bottom of a spherical bottom 17 of the drinking bird body 1, the coil magnet conducting columns 32 are arranged on a base 11 of the drinking bird body 1 and arranged in a circular arc shape, each of the coils 33 is sleeved on outside of the corresponding coil magnet conducting column 23. When the magnets 31 swing along with the spherical bottom 17 of the drinking bird body 1, the magnets 31 cut magnetic induction lines of the coils 33 to generate a voltage.

In some embodiments, the piezoelectric module 2 further includes a substrate 27, a middle shaft 25, a shaft seat 26 and cantilever beam clamps 21. The middle shaft 25 is fixed to the substrate 27 through the shaft seat 26, and the cantilever beam 23 is fixed to the middle shaft 25 through the cantilever beam clamps 21.

In some embodiments, the piezoelectric sheet 22 is adhered to a position of the cantilever beam 23 having maximum bending deflection through conductive epoxy adhesive, and the width of the piezoelectric sheet 22 is the same as that of the cantilever beam 23, so that a deformation amount of the piezoelectric sheet 22 is increased. The piezoelectric sheet 22 is made of a PZT piezoelectric ceramic material, which is a composition based on a lead titanate solid solution and a lead zirconate solid solution, has a Curie point ranged from 300 Celsius Degree to 400 Celsius Degree and is relatively stable in a large temperature range and remarkable in terms of piezoelectric effect.

In some embodiments, the drinking bird body 1 includes a base 11, supports 12, a swing frame 13, counterweights 14 and a swinging device. The swinging device includes a head 15, a branch pipe 16 and a spherical bottom 17. The base 11 is a U-shaped base, the supports 12 are arranged on two sides of a top of the base 11 respectively, the swing frame 13 is connected between two the supports 12, and the swing frame 13 and the supports 12 are movably connected. The support 12 is provided with a stopper to prevent the swing device from moving excessively. A sleeve is arranged in a middle of the swing frame 13, the branch pipe 16 is fixed in the sleeve, the head 15 is arranged at a top of the branch pipe 16, the spherical bottom 17 is arranged at a bottom of the branch pipe 16. A through hole communicating with the branch pipe 16 is formed in the head 15, the counterweights 14 are arranged at a top end of the head 15, and a diameter of the head 15 is smaller than that of the spherical bottom 17.

Particularly, the head 15 is a thin-wall glass ball wrapped with water-absorbing cloth, the spherical bottom 17 is a thin-wall glass ball, the branch pipe 16 is a glass pipe, and an inner cavity of the head 15, an inner cavity of the branch pipe 16 and an inner cavity of the spherical bottom 17 are communicated to form a cavity filled with diethyl ether liquid.

In some embodiments, the coil magnet conducting columns 32 are made of a material with high magnetic conductivity and low magnetic resistance. The coils 33 are shaped as a square to achieve the maximum magnetic flux. The magnets 31 are arranged in a mode that N and S magnetic poles are alternated, which significantly increases a change rate of the magnetic flux, and improves power generation cavity of the device.

Figure 4:
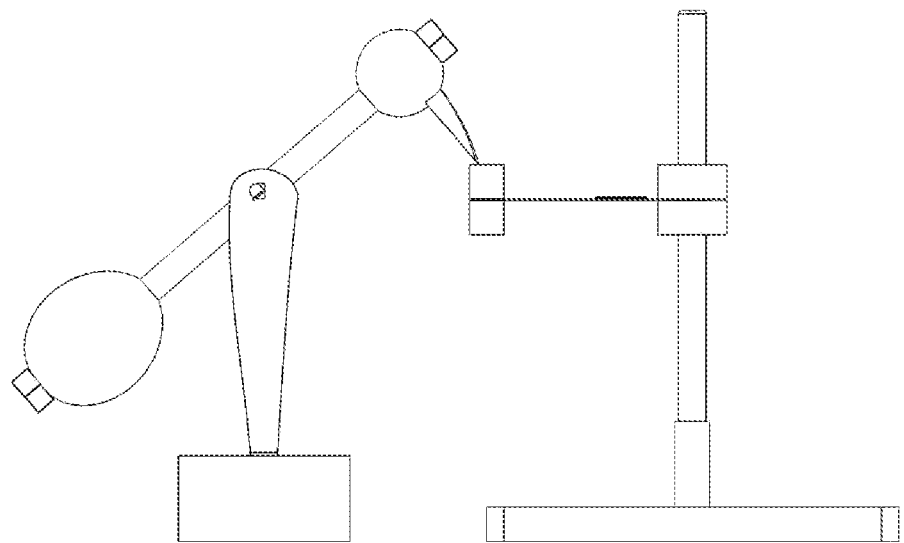
FIG. 4 is a motion position view of the normal-temperature heat engine power generation device based on a drinking bird when a cantilever beam is impacted according to the present disclosure.
Figure 5:
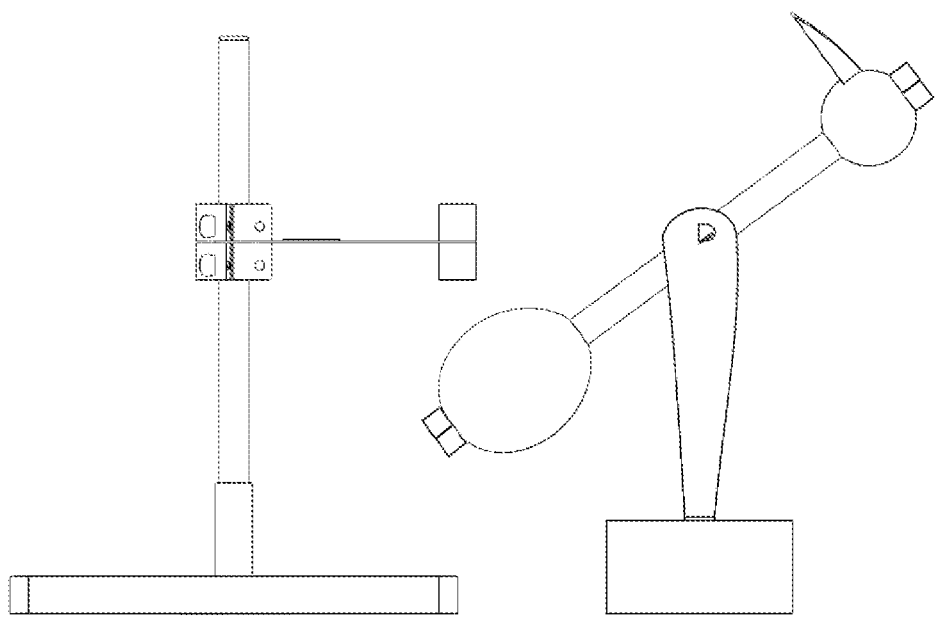
FIG. 5 is a view of the normal-temperature heat engine power generation device based on a drinking bird in a maximum motion position according to the present disclosure.

The normal-temperature heat engine power generation device based on a drinking bird in the present embodiment works as follows:

After water drips on the water-absorbing cloth wrapped on the head 15, water slowly evaporates at normal temperature to take away heat, a air pressure of a upper part of the inner cavity in the swing device is reduced, diethyl ether liquid at a lower part of the inner cavity is forced by a pressure difference up to the upper part of the inner cavity, which causes a gravity center of the swing device to raise, and the swing device starts to swing. As shown in FIG. 4, the figure illustrates the position when the head 15 impacts the working loads 24 after swinging. At the moment, the working loads 24 are impacted, the cantilever beam 23 starts to vibrate, and the piezoelectric sheet 22 deforms, so that a potential difference is generated on a surface of the piezoelectric sheet 22, and electrical energy is generated. Then, the swing device continues to swing, and as shown in FIG. 5, the figure illustrates the state when the swing device swings to a maximum state. When the swing device swings continuously between two positions shown in FIGS. 4 and 5, the coils 33 are fixed on the base 11, the magnets 31 move along with the swing device, and the coils 33 cut the magnetic induction lines to generate electric energy.

Several examples are used for illustration of the principles and implementation methods of the present disclosure. The description of the embodiments is used to help illustrate the method and its core principles of the present disclosure. In addition, those skilled in the art can make various modifications in terms of specific embodiments and scope of application in accordance with the teachings of the present disclosure. In conclusion, the content of this specification shall not be construed as a limitation to the present disclosure.

What is claimed is:

1. A normal-temperature heat engine power generation device based on a drinking bird, comprising: a drinking bird body, a piezoelectric module and an electromagnetic module, wherein the piezoelectric module is opposite to the drinking bird body, the piezoelectric module comprises a cantilever beam, a piezoelectric sheet arranged on the cantilever beam and working loads arranged at an end of the cantilever beam; when a head of the drinking bird body swings downwards, a tip of a beak can impact the working loads; and the electromagnetic module comprises magnets, coils and coil magnet conducting columns, the magnets are arranged at a bottom of a spherical bottom of the drinking bird body, the coil magnet conducting columns are arranged on a base of the drinking bird body and are arranged in a circular arc shape, each of the coils is sleeved on outside of corresponding coil magnet conducting column, when the magnets swing along with the spherical bottom of the drinking bird body, the magnets cut magnetic induction lines of the coils to generate a voltage.

2. The normal-temperature heat engine power generation device based on a drinking bird according to claim 1, wherein the piezoelectric module further comprises a substrate, a middle shaft, a shaft seat and cantilever beam clamps; and the middle shaft is fixed to the substrate through the shaft seat, and the cantilever beam is fixed to the middle shaft through the cantilever beam clamps.

3. The normal-temperature heat engine power generation device based on a drinking bird according to claim 1, wherein the piezoelectric sheet is adhered to a position of the cantilever beam having a maximum bending deflection through conductive epoxy adhesive, and a width of the piezoelectric sheet is same as that of the cantilever beam, so that a deformation amount of the piezoelectric sheet is increased.

4. The normal-temperature heat engine power generation device based on a drinking bird according to claim 3, wherein the piezoelectric sheet is made of a PZT piezoelectric ceramic material.

5. The normal-temperature heat engine power generation device based on a drinking bird according to claim 1, wherein the drinking bird body comprises a base, supports, a swing frame, counterweights and a swinging device; the swinging device comprises a head, a branch pipe and a spherical bottom; the base is a U-shaped base, the supports are arranged on two sides of a top of the base respectively, the swing frame is connected between two the supports, the swing frame and the supports are movably connected, a sleeve is arranged in a middle of the swing frame, the branch pipe is fixed in the sleeve, the head is arranged at a top of the branch pipe, the spherical bottom is arranged at a bottom of the branch pipe, a through hole communicating with the branch pipe is formed in the head, the counterweights are arranged at a top end of the head, and a diameter of the head is smaller than that of the spherical bottom.

6. The normal-temperature heat engine power generation device based on a drinking bird according to claim 5, wherein the head is a thin-wall glass ball wrapped with water-absorbing cloth, the spherical bottom is a thin-wall glass ball, the branch pipe is a glass pipe, and an inner cavity of the head, an inner cavity of the branch pipe and an inner cavity of the spherical bottom are communicated to form a cavity filled with diethyl ether liquid.

7. The normal-temperature heat engine power generation device based on a drinking bird according to claim 1, wherein the coil magnet conducting columns are made of a material with high magnetic conductivity and low magnetic resistance.

8. The normal-temperature heat engine power generation device based on a drinking bird according to claim 1, wherein the coils are shaped as a square.

9. The normal-temperature heat engine power generation device based on a drinking bird according to claim 1, wherein the magnets are arranged in a mode that N and S magnetic poles are alternated.

* * * * *